US005890586A

United States Patent [19]

Adelhardt et al.

[11] Patent Number: 5,890,586

[45] Date of Patent: Apr. 6, 1999

[54] SWITCHING ELEMENT CAST INTO AN INSULATING COMPOUND AND METHOD OF MAKING THE SAME

[75] Inventors: Siegbert Adelhardt, Pottenstein; Helmut Brunnhuber, Auerbach; Wilfried Pöhner, Vorra; Stefan Gebhardt, Weiherhammer, all of Germany

[73] Assignee: Cherry Mikroschalter GmbH, Auerbach, Germany

[21] Appl. No.: 949,835

[22] Filed: Oct. 14, 1997

[30] Foreign Application Priority Data

Oct. 14, 1996 [DE] Germany ........................ 196 42 403.8

[51] Int. Cl.$^{6}$ ............................ H01H 35/02; H01L 23/28

[52] U.S. Cl. ......................... 200/302.1; 29/622; 174/52.2

[58] Field of Search .............................. 29/622, 854, 855, 29/856, 887; 174/52.1, 52.2; 200/293, 302.1, 302.2, 302.3

[56] References Cited

U.S. PATENT DOCUMENTS

| | | | |
|---|---|---|---|
| 4,204,231 | 5/1980 | Permenter | 358/247 |
| 4,877,930 | 10/1989 | Fukuma | 200/302.2 |
| 4,895,998 | 1/1990 | Bevington | 174/52.2 |
| 5,293,002 | 3/1994 | Grenet et al. | 174/52.2 |

*Primary Examiner*—Michael A. Friedhofer
*Attorney, Agent, or Firm*—Klaus J. Bach

[57] ABSTRACT

In a resin-embedded switching element provided with a casting containment, which encloses an area of the switching element to be covered by a resin, the casting containment has a fill hole consisting of a blind bore having at its inner end a diaphragm which is sufficiently thin that it can be ruptured by casting resin supplied to the fill hole under pressure and a measuring opening is formed in the top of the casting containment through which air can escape during filling of the casting containment with liquid casting resin and the level of the casting resin in the casting containment can be controlled.

10 Claims, 3 Drawing Sheets

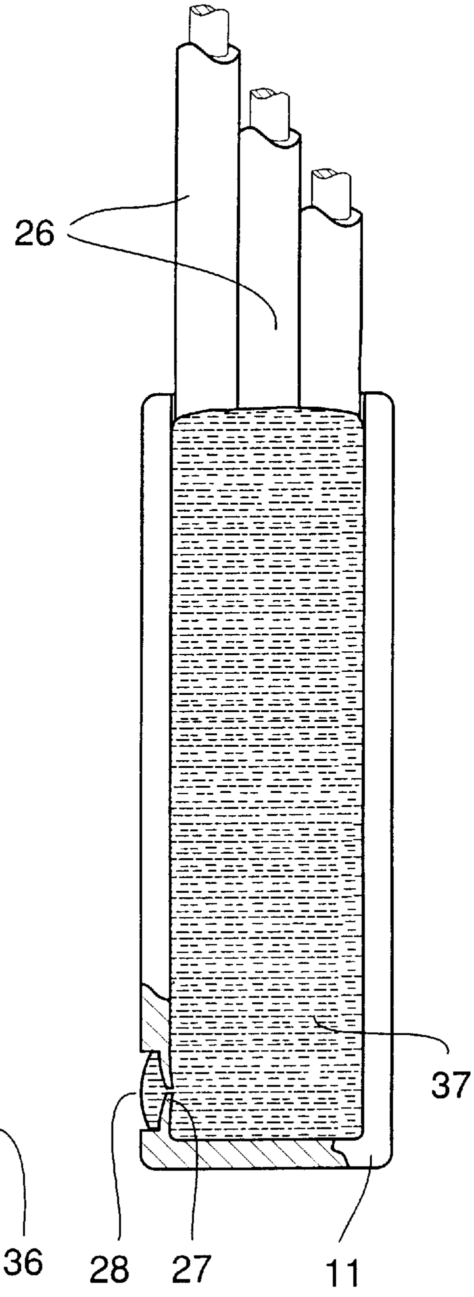
Fig. 5
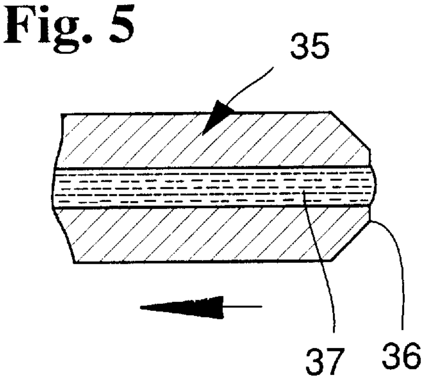

SWITCHING ELEMENT CAST INTO AN INSULATING COMPOUND AND METHOD OF MAKING THE SAME

BACKGROUND OF THE INVENTION

The invention resides in a switching element, which is at least partially embedded in a casting compound and a method of applying the casting compound to the switching element for waterproofing the switching element, preferably the area of connection for electrical conductors.

The sealing of electrical switching elements by casting them into watertight casting compounds is generally known and in wide use. In such processes, not only the complete switching components are cast into a housing, but often only the electrical connections in the area of the connector pins are embedded in a casting compound. For this purpose, a casting containment is provided in the area of the connecting pins which is either integral or which can be attached and which is filled from the top in a well-known manner by a dispensing unit. During the filling procedure, a dispensing needle is so guided, that the filling process starting at the containment bottom proceeds as uniformly as possible toward the containment top edge. Single component or two-component materials may be used for that purpose preferably in the form of liquid resins which are hardened for example by being heated after they have been filled into the containment.

Such well known casting in a containment, which is open on top or at least partially open, has important disadvantages. In manual operations, the work result depends to a great degree on the skill of the person who guides the dispensing needle as it is important to fill the containment uniformly to prevent the formation of air bubbles. However, this disadvantage occurs not only during manual operation, but also with mechanically controlled dispensing units since a uniform filling procedure from the bottom to the top is impeded by wire connections or wires. During the filling of the upwardly open casting containments turbulence occurs even during carefully handled filling procedures whereby cavities and air bubbles may be generated so that the hardened cast may include cavities or bubbles, which may lead to leaks. Also, difficulties are encountered with the accurate dosing of the fill volume so that, with non-uniform filling, there may be in the containment and at the connecting cables excess material which must be removed, that is, scraped off by expensive additional procedures. As a result, the cast elements may not have an attractive appearance and may be unnecessarily expensive. Also, the timing for the casting procedure cannot be controlled in an optimal manner.

FIG. 1 shows a simple arrangement for the casting of microswitches as it is known in the art, wherein several switches 10 are arranged side-by-side in a support structure 12 with a casting containment 11 disposed on the switches 10. The wires of a wire harness 15 are already soldered to the connector pins 16. The dispensing or dosing unit 17 with the dispensing needle 18 is moved from casting containment 11 to casting containment in order to fill the containments with casting material through the top opening.

With the methods used so far a partially or fully automatic filling process could not be utilized because of the disadvantages mentioned earlier.

It is therefore the object of the present invention to provide a arrangement, whereby switching elements can be either partially or fully embodied in a casting resin in a housing or a casting containment wherein the housing or containment parts are so formed that the process can be performed fully automatically, while essentially no air enclosure or air bubbles can develop during the casting procedure.

SUMMARY OF THE INVENTION

In a resin-embedded switching element provided with a casting containment, which encloses an area of the switching element to be covered by a resin, the casting containment has a fill hole consisting of a blind bore having at its inner end a diaphragm which is sufficiently thin that it can be ruptured by casting resin supplied to the fill hole under pressure and a measuring opening is formed in the top of the casting containment through which air can escape during filling of the casting containment with liquid casting resin and the level of the casting resin in the casting containment can be checked and controlled.

With this arrangement, the casting containment may fully surround the switching device or it may be attached in a cap-like fashion to the switching device. The fill bore is preferably provided at the bottom of the containment and, on the opposite side thereof, there may be provided a measurement opening and a wire harness opening.

The switch element preferably comprises a switch with connector pins which extend into the casting containment. The switch element housing has preferably openings also provided with diaphragms, which are pierced by the connector pins during mounting of the pins into the housing.

The fill bore preferably includes a conical blind hole extending toward the center of the bottom part of the containment and the blind hole is closed at its inner end by a thin-walled structure.

With such a casting containment in the form of a casting cap, the casting material can be injected through the dispensing needle into the bottom of the space to be filled, which, in this way, is uniformly filled from the bottom up to the measuring opening. Preferably, the wire harness is so arranged in the space to be filled with casting resin that the connecting wires extend in the space essentially vertically, whereby a uniform rising of the casting material during the filling process is obtained and bubble formation is avoided.

In order to permit placement of the dispensing needle into the fill bore in a sealing fashion the diameter of the fill bore is somewhat smaller than the outer diameter of the dispensing needle which is preferably conical at its front end for insertion into the fill bore.

With the method according to the invention for the water tight sealing of switch elements, that is, the sealing of the connector areas of electrical switching elements, particularly of microswitches with the aid of a casting containment, which is arranged in the socket area and surrounds the connectors, the casting material is injected into the casting containment by the dispensing needles. The switch element is so disposed in a support structure that a fill bore in the wall of the casting containment, which is closed by a diaphragm, is disposed at the bottom end of the volume to be filled with casting material. The dispensing needle is inserted into the fill bore and casting material is dispensed under pressure whereby the diaphragm is fractured and casting material flows into the casting containment.

In a particular embodiment of the invention, the casting containment is closed by portions of the support structure or by a cover structure so that only the measuring opening remains.

It is also possible that the level of the casting material rising in the casting containment is measured by a laser beam through the measuring opening, whereby the fill level can be determined and the filling process can be controlled.

The advantages and various features of the invention will become apparent from the following description of an embodiment of the invention as shown in the accompanying drawings:

BRIEF DESCRIPTION OF THE DRAWINGS

FIGS. 3, 4, and 5 show schematically three subsequent steps of the filling procedure.

DETAILED DESCRIPTION OF AN EMBODIMENT OF THE INVENTION

Figure 2:
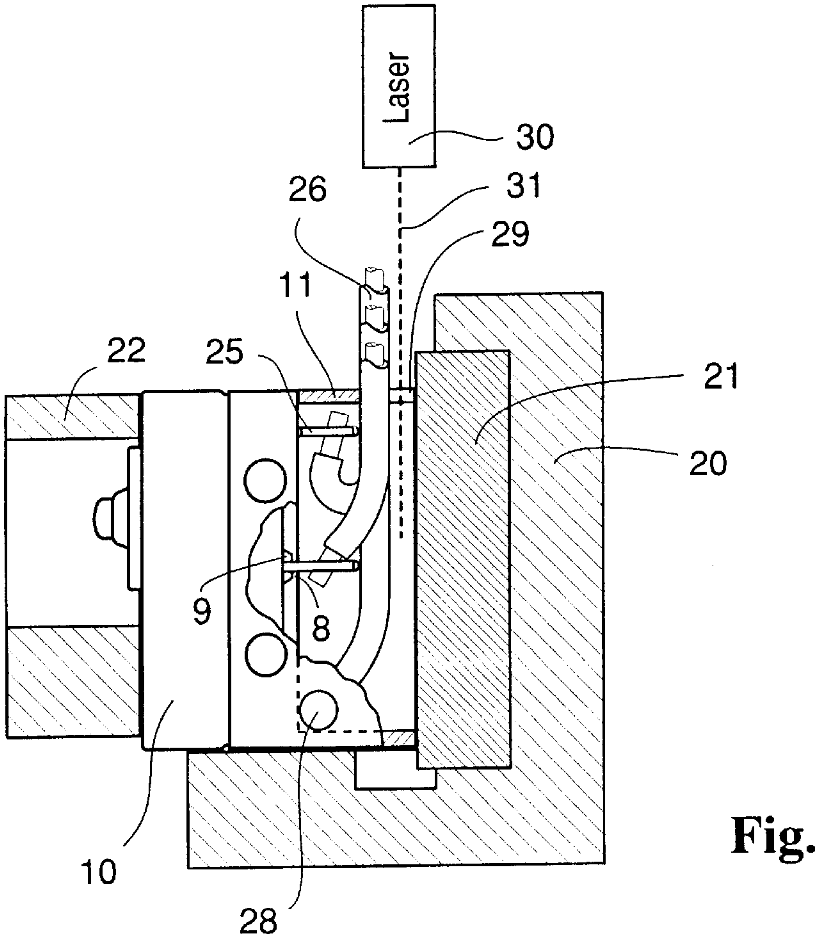
FIG. 2 shows a filling arrangement according to the invention for encapsulating a portion of a microswitch.

FIG. 2 shows schematically a filling arrangement for automatically casting, that is, embedding the connecting area of a microswitch in a resin. The arrangement comprises a support structure 20, which is preferably L-shaped and which includes a vertical wall provided with a sealing plate 21 against which the open side of the casting containment 11 of a microswitch 10 is pressed by means of a plunger 22. In the arrangement as shown, the casting containment 11 is an integral part of the bottom part of the switch housing. Connector pins 25 extend into the casting containment and the wires of a wire harness 26 are soldered to the connector pins 25. The wire harness 26 is preferably so arranged that it extends vertically within the casting containment 11 in the support structure 20 and projects from the upper end of the casting containment. In one embodiment, the switch element housing 10 has openings 9 through which the connector pins 25 extend. The openings 9 are provided with diaphragms 8 which are pierced by the connector pins 25 during mounting of the pins 25 into the housing 10.

The casting containment includes a fill hole 28 arranged at the lower end of the containment wall, that is, about at the lowest point of the casting volume to be filled. In its upper end wall, it includes a measuring opening 29 on top of which a laser beam generator 30 is so disposed that its laser beam 31 passes through the measuring opening 29 into the interior of the casting containment. The laser beam generator is so arranged, that its laser beam 31 extends about normal to the rising level of the casting material as will be explained below.

Figure 1:
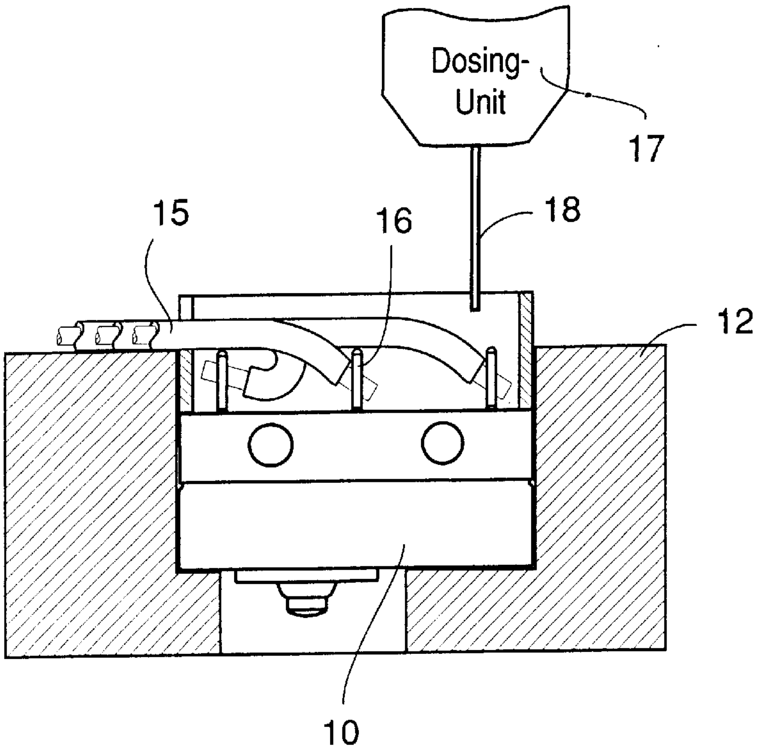
Fig. 1 Prior Art
FIG. 1 shows a filling arrangement according to the state-of-the-art.

The arrangement further includes a dosing unit which is not shown in FIG. 2, but which, like that shown in FIG. 1 (17) includes a dispensing needle which however is inserted into the fill hole 28.

Figure 3:
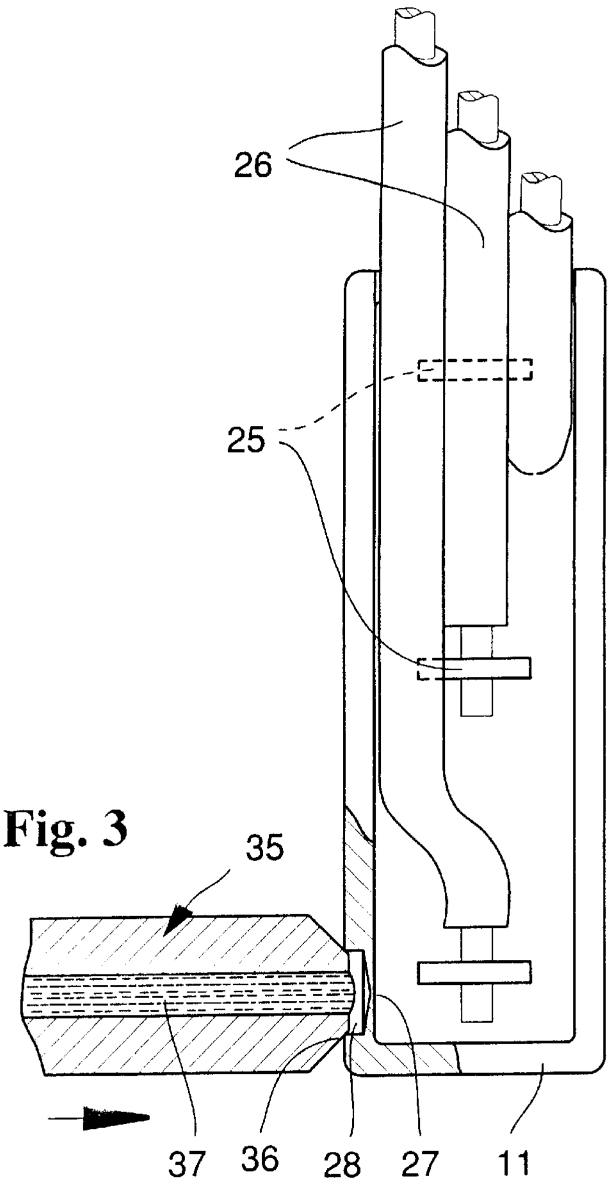

FIG. 3 shows the casting containment in a partial sectional view with the dispensing needle placed onto the fill hole 28. The fill hole is a blind bore with a conical bore end wall, which in the center of the bore is very thin and forms a diaphragm 27, which closes the fill hole 28. It can further be seen from FIG. 3, that the wire ends soldered to the connector pins 25 of the wire harness 26 project upwardly from the casting containment 11. The measuring opening is disposed in front of the wire harness 26 and is not shown in FIG. 3.

Figure 4:
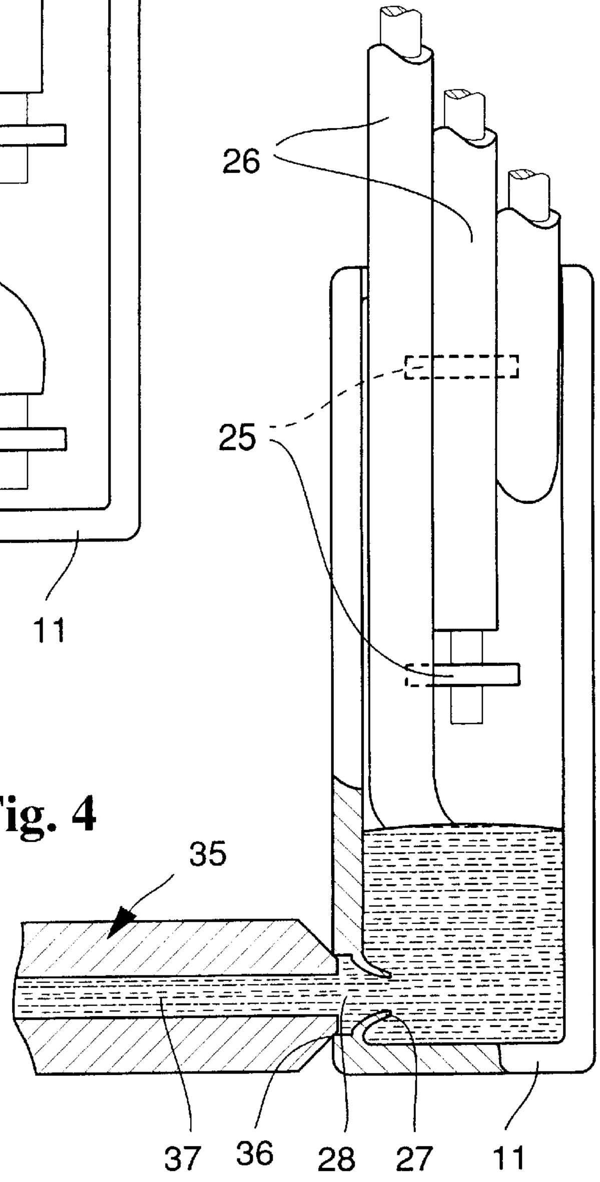

For casting the dispensing needle 35 is pressed, with its cone-like front end, into sealing engagement with a seal edge 36 of the fill hole 28 and as shown in FIG. 4, the casting material 37 is then pressed into the casting containment 11. Under the pressure applied, the diaphragm 27 ruptures so that the casting material can then slowly flow into the bottom end of the casting containment 11. It slowly rises in the casting containment while displacing the air which escapes upwardly through the measuring opening, which is not shown. The casting material level rises and the casting material fills the casting containment from the bottom without forming cavities or air bubbles in the casting material. Preferably, the casting material is highly fluid to insure that no air enclosures are formed during the filling procedure.

The laser beam 31 directed into the casting containment 11 through the measuring opening 29 as shown in FIG. 2 continuously senses the liquid level during the casting procedure by continuously measuring the distance of the laser apparatus from the surface of the casting material. The filling procedure is controlled on the basis of these measuring results and is discontinued as soon as the liquid level reaches the measuring opening, which is disposed at the highest point of the casting containment. This is generally at the level at which the wire harness exits the casting containment 11.

After reaching the predetermined level where the wire harness exits the casting containment the dosing unit cuts off the supply of the liquid casting material 37, so that, because of the release of pressure of the liquid in the dispensing needle and the static pressure of the still liquid casting material in the casting containment, the diaphragm 27 closes whereby a return flow of casting material out of the fill hole 28 is prevented. The closing of the fill bore is facilitated by the cone-like shape of the end wall of the fill hole, whereby the diaphragm structure ruptured by the pressure of the casting material returns to its original position when the pressure is released since the elasticity of the material provides for a return force.

With the measures according to the invention, the casting material can be supplied to the areas of a switch to be enclosed by the casting material in a partially or fully automatic fashion, wherein the filling procedure can be accurately controlled by the use of the laser beam. Accordingly, the procedure can be performed with shortened cycles, that is, the production rate can be increased and the casting material can be introduced into the casting containment in a uniform manner. It is not necessary to remove excess casting material after curing of the casting material. Furthermore, the filling takes place without generating turbulence so that no cavities or air bubbles are formed in the casting material.

What is claimed is:

1. A resin embedded switching element having a casting containment enclosing adjacent said switching element, an interior space to be filled with resin, said casting containment having a wall with a fill hole consisting of a blind bore having an inner end, a diaphragm disposed at the inner end of said blind bore and separating said fill hole from the interior space of said casting containment, said diaphragm being sufficiently thin such that the diaphragm can be ruptured by resin supplied to said fill hole under pressure, and a measurement opening formed in said casting containment in an end wall portion thereof opposite said fill hole.

2. A resin embedded switching element according to claim 1, wherein said casting containment is formed integrally with said switching element.

3. A resin embedded switching element according to claim 1, wherein said casting containment comprises a cap for placement on said switching element said cap including said fill hole and a wire harness opening formed in said cap opposite said fill hole.

4. A resin embedded switching element according to claim 1, wherein said switching element is a switch which includes a switch housing with connector pins extending into said casting containment and said connector pins extend through bores which have been formed in the switch housing and which include diaphragms that have been pierced by the connector pins upon mounting of the connector pins.

5. A resin embedded switching element according to claim 1, wherein said fill hole is a blind bore with a cone-shaped end wall forming said diaphragm.

6. A resin embedded switching element according to claim 5, wherein a dispensing needle is provided for supplying said casting resin to said fill hole, said fill hole having a diameter smaller than the outer diameter of said dispensing needle to permit sealing engagement of said dispensing needle with the wall of said fill hole.

7. A resin embedded switching element according to claim 6, wherein said dispensing needle has a conical tip for sealing engagement with the wall of said fill hole.

8. A method for water-proof sealing connector areas of electrical switching elements, by covering a switch socket area with a casting resin, said method comprising the steps of enclosing an area of said switching elements to be covered by a casting resin with a casting containment having a top and a bottom area provided with a resin fill hole having an end membrane in such a way that the fill hole is disposed in the bottom area of said casting containment, engaging said fill hole with a dispensing needle so as to sealingly engage said fill hole and supplying liquid casting resin through said dispensing needle to said fill hole under sufficient pressure that said diaphragm is ruptured and said liquid resin flows into said casting containment.

9. A method according to claim 8, wherein said casting containment is closed except for a measuring opening remaining in its top through which air escapes during filling of the casting containment and through which the level of the liquid casting resin in the containment can be measured.

10. A method according to claim 9, wherein the level of the casting resin in said containment is measured by a laser beam passing through said measuring opening and providing casting resin level values, and the casting resin filling procedure and level of the casting resin in the containment are controlled depending on said casting resin level values.

* * * * *